US006682991B1

United States Patent
Hino et al.

(10) Patent No.: US 6,682,991 B1
(45) Date of Patent: Jan. 27, 2004

(54) GROWTH METHOD OF A NITRIDE III-V COMPOUND SEMICONDUCTOR, MANUFACTURING METHOD OF A SEMICONDUCTOR DEVICE, AND SEMICONDUCTOR DEVICE

(75) Inventors: Tomonori Hino, Miyagi (JP); Takeharu Asano, Kanagawa (JP); Tsunenori Asatsuma, Kanagawa (JP); Satoru Kijima, Miyagi (JP); Kenji Funato, Kanagawa (JP); Shigetaka Tomiya, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/448,584

(22) Filed: Nov. 24, 1999

(30) Foreign Application Priority Data

Nov. 26, 1998 (JP) ............................................ P10-335851

(51) Int. Cl.$^7$ .............................................. H01L 21/20
(52) U.S. Cl. .......................................... 438/481; 438/47
(58) Field of Search .................. 438/481, FOR 244, 438/FOR 249, FOR 286, FOR 293, 47

(56) References Cited

U.S. PATENT DOCUMENTS

| | | | | |
|---|---|---|---|---|
| 4,353,935 A | * | 10/1982 | Symersky | |
| 4,678,538 A | * | 7/1987 | Haond et al. | |
| 4,971,928 A | * | 11/1990 | Fuller | |
| 4,999,314 A | * | 3/1991 | Pribat et al. | |
| 5,208,167 A | * | 5/1993 | Nakamura | |
| 5,294,564 A | * | 3/1994 | Karapiperis et al. | |
| 5,326,716 A | * | 7/1994 | Bauser et al. | |
| 6,111,277 A | * | 8/2000 | Ikeda | |
| 6,255,198 B1 | * | 7/2001 | Linthicum et al. | |
| 6,271,104 B1 | * | 8/2001 | Razeghi et al. | |

FOREIGN PATENT DOCUMENTS

EP        0982819 A1        3/2000

OTHER PUBLICATIONS

Sasaoka et al/ "High quality InGaN MQW on low–dislocation–density GaN substrate grown by hydride vapor–phase epitaxy"/ Jun. 11, 1998/ Elsevier/ vol. 189–190/ pp. 61–96.*

Article entitled: "InGaN/GaN/AlGaN–based laser diodes with modulation–doped strained–layer superlattices grown on an epitaxially laterally overgrown GaN substrate", Nakamura et al., *Appl. Phys. Lett.* 72 (2), Jan. 12, 1998, pp. 211–213.

Article entitled: "Thick GaN Epitaxial Growth with Low Dislocation Density by Hydride Vapor Phase Epitaxy", Usui et al., *Jpn. J. Appl. Phys.* vol. 36 (1997) pp. 899–902.

(List continued on next page.)

*Primary Examiner*—George Fourson
*Assistant Examiner*—Joannie Adelle Garcia
(74) *Attorney, Agent, or Firm*—Sonnenschein, Nath & Rosenthal LLP

(57) ABSTRACT

When making a growth mask on a substrate and using the growth mask to selectively grow nitride III–V compound semiconductors on the substrate, a multi-layered film including a nitride forming at least its top surface is used as the growth mask. The growth mask may be combination of an oxide film and a nitride film thereon, combination of a metal film and a nitride film thereon, combination of an oxide film, a film thereon made up of a nitride and an oxide, and a nitride film thereon, or combination of a first metal film, a second metal film thereon different from the first metal film and a nitride film thereon, for example. The oxide film may be a SiO$_2$, for example, the nitride film may be a TiN film or a SiN film, the film made up of a nitride and an oxide may be a SiNO film, and the metal film may be a Ti film or a Pt film, for example.

31 Claims, 14 Drawing Sheets

OTHER PUBLICATIONS

S. Ruvimov et al., "Microstructure of Ti/Al and Ti/Al/Ni/Au Ohmic contacts for n–GaN", Applied Physics Letters, vol. 69, No. 11, Sep. 9, 1996, pp. 1556–1558.

Y.–F. Wu et al., "Low Resistance Ohmic Contact to n–GaN with a Separate Layer Method", Solid—State Electronics, vol. 41, No. 2, 1997, pp. 165–168.

B. Luther et al., "Titanium and titanium nitride contacts to n–type gallium nitride", Semiconductor Science and Technology, vol. 13, No. 11, 1998, pp. 1322–1327.

S. Nakamura, "InGaN/GaN/AlGaN–based laser diodes with modulation–0doped strained–layer superlattices grown on an epitaxially laterally overgrown GaN substrate", Applied Physics Letter, vol. 72, No. 2, Jan. 12, 1998, pp. 211–213.

B. Beaumont et al., "Lateral overgrown of GaN on patterned GaN/sapphire substrate via selective metal organic vapour phase epitaxy: a route to produce self supported GaN substrates", Journal of Crystal Growth, vol. 189–190, Jun. 15, 1998, pp. 97–102.

B. Beaumomt et al., "Magnesium induced changes in the selective growth of GaN by metalorganic vapor phase epitaxy", Applied Physics Letters, vol. 72, No. 8, Feb. 23, 1998, pp. 921–923.

B. Beaumont et al., "Lateral Overgrowth of GaN on Patterned GaN/Sapphire Substrate Via Selective Metal Organic Vapour Phase Epitaxy: a route to produce self supported GaN Substrates," Journal of Crystal Growth, Vols. 189/190, 1998, pp. 97–102.

* cited by examiner

US 6,682,991 B1

GROWTH METHOD OF A NITRIDE III-V COMPOUND SEMICONDUCTOR, MANUFACTURING METHOD OF A SEMICONDUCTOR DEVICE, AND SEMICONDUCTOR DEVICE

BACKGROUND OF THE INVENTION

1. Field of the Invention

This invention relates to a growth method of a nitride III–V compound semiconductor, manufacturing method of a semiconductor device, and semiconductor device which are especially suitable for application to semiconductor lasers, light emitting diodes or electron transport devices using nitride III–V compound semiconductors.

2. Description of the Related Art

GaN compound semiconductors are direct transitional semiconductors having forbidden band widths ranging from 1.9 eV to 6.2 eV and enabling realization of light emitting devices capable of emitting light over a wide range from the visible spectrum to the ultraviolet. For these properties, they have lately become of major interest and placed under active developments. Additionally, GaN semiconductors have a large possibility as material of electron transport devices such as FET. Saturation electron velocity of GaN is approximately $2.5 \times 10^7$ cm/s, which is larger than those of Si, GaAs and SiC, and its breakdown electric field is as large as approximately $5 \times 10^6$ V/cm next to diamond. For these reasons, GaN semiconductors have been expected to be greatly hopeful as materials of high-frequency, high-temperature, high-power electron transport devices.

These semiconductor devices, in general, are made of GaN semiconductors grown on a substrate. Therefore, crystalline qualities of GaN semiconductors are of great importance for ensuring and improving performances of these semiconductor devices. However, since there is no appropriate substrate good in lattice matching with GaN, sapphire substrates are mainly being used for growing GaN semiconductors, their lattice mismatching with GaN is very large.

Failure in lattice matching with a substrate largely affects crystalline properties of GaN compound semiconductors grown thereon, and it can be a large factor of crystal defects produced in GaN semiconductor layers.

To minimize crystal defects, conventionally employed was a technique of growing a buffer layer of GaN or AlN on a sapphire substrate under a low temperature, then increasing the substrate temperature to about 1000° C. to re-crystallize it, and thereafter growing GaN semiconductors thereon, thereby to improve the quality of GaN semiconductors (for example, Appl. Phys. Lett. 48(1986)353, Jpn. J. Appl. Phys. 30(1991)L1705).

Even with this technique, however, reduction of crystal defects is limited, and the density of defects (especially, threaded dislocation) is still as high as $10^8$ through $10^{10}$ cm$^{-2}$.

For the purpose of decreasing the density of such defects, it has been reported to grow a GaN layer on a substrate conventionally used to grow III–V compound semiconductor like GaAs conventionally, then provide a mask of an insulating film such as silicon oxide film in form of elongated belts extending in the <11–20> direction in predetermined intervals on the GaN layer, and thereafter selectively grow a GaN layer by hydride vapor phase epitaxy (HVPE) (for example, Jpn. J. Appl. Phys. 36(1997)L899). This technique can certainly decrease the density of threading dislocation to approximately $6 \times 10^7$ cm$^{-2}$.

There are also other techniques of performing selective growth on a substrate via a mask made on the substrate to extend in a direction different by 90° from that of the above-introduced example, and making a semiconductor light emitting structure on the selectively grown film. This technique is configured to grow a GaN layer on a sapphire substrate, for example, by metal organic chemical vapor deposition (MOCVD), next make a mask of silicon oxide to extend in the <1–100> direction in form of elongated belts in predetermined intervals, thereafter grow a GaN layer thereon by MOCVD and further make a light emitting structure (Appl. Phys. Lett. 72(1998)211, Jpn. J. Appl. Phys. 36(1997)L899). According to these reports, the density of threading dislocation can be decreased to approximately $1 \times 10^7$ cm$^{-2}$. In these examples, it has been confirmed that the lifetime of a semiconductor laser made above is elongated to 1000 hours or more.

However, according to the Inventor's own knowledge, the GaN semiconductor layer obtained by conventional growth methods introduced above still include a lot of crystal defects near the boundary with the substrate, and the density of defects has not been reduced sufficiently.

OBJECTS AND SUMMARY OF THE INVENTION

It is therefore an object of the invention to provide a growth method of a nitride III–V compound semiconductor capable of growing a single-crystal nitride III–V compound semiconductor of a high quality with a low density of crystal defects, and also relates to a semiconductor device manufactured by using this growth method and a manufacturing method of the semiconductor device.

The inventor conducted research to overcome the problems involved in the conventional techniques. The inventor's research is summarized below.

FIGS. 1 and 2 show results of measurement of X-ray diffraction spectrum, taking samples each prepared by growing a GaN layer by MOCVD on a c-plane sapphire substrate via a mask of $SiO_2$ made in form of elongated belts extending in the <1–100> direction in predetermined intervals on the c-plane sapphire substrate, and introducing X-rays into one of the samples from a direction horizontal to the mask (see FIG. 3) and into the other sample from a direction vertical to the mask (see FIG. 4).

It is confirmed from FIGS. 1 and 2 that, although the c-axis inclination exhibits a single-peak property in the samples in which the X-rays enter in parallel to the mask, it exhibits a multi-peak property in the samples in which X-rays enter vertically in the mask. It has been noted through Transmission Electron Microscopic (TEM) analysis that the longitudinal crystal axes deviate at three positions on areas of the mask for selective growth and areas without the mask as shown in FIG. 5. In FIG. 5, inclination of the crystal axes on the mask is not limited to the illustrated example.

If a selectively grown film includes any inclination in crystal axis, especially if it includes discontinuous changes as indicated above, then it is presumed that lattice defects such as dislocation have been introduced along the boundary. Actually, dislocation was observed through TEM, and introduction of such defects may be a factor of deteriorating characteristics of a semiconductor laser made thereon.

The Inventor found, as a result of various researches, that the use of a nitride to form the outermost surface of the mask be effective to prevent inclination of crystal axes of a film grown on the mask for selective growth.

FIGS. 6 and 7 show results of measurement of X-ray diffraction spectrums, taking samples each prepared by growing a GaN layer by MOCVD on a c-plane sapphire substrate via a SiN/SiO$_2$ mask made by stacking a SiN film on a SiO$_2$ film in form of elongated belts extending in the <1–100> direction in predetermined intervals on the c-plane sapphire substrate, and introducing X-rays into one of the samples from a direction horizontal to the mask and into the other sample from a direction vertical of the mask.

It is confirmed from FIGS. 6 and 7 that, by selective growth using the mask whose outermost surface is SiN, whichever of the parallel and vertical directions of the mask the X-rays are introduced in, each sample exhibits only one as the peak indicating inclination of crystal axes. Additionally, it is confirmed that the full width half maximum indicating variance in inclination of crystal axes within the measured range. This demonstrates a high crystalline quality of the selectively grown film.

This does not mean that crystal axes of the selectively grown film change in every region as shown in FIG. 5, but does demonstrate that longitudinal crystal axes are aligned over the entirety of the selectively grown film as shown in FIG. 8 and that the entirety of the film is uniform in quality.

Especially in a semiconductor light emitting device using a nitride III–V compound semiconductor, if the mask used for selective growth is a multi-layered film using silicon nitride or titanium nitride as the nitride forming the outermost surface of the mask and using titanium as the underlying layer, selective growth is easier than the case using titanium alone as the mask for selective growth, because the more stable nitride forms the surface. Additionally, when titanium is used as the n-side electrode, the current in an n-type layer, which could conventionally flow solely in the transverse direction, can readily flow in the longitudinal direction. Therefore, its operation voltage can be reduced.

It is confirmed from FIGS. 7B and 7C that, even in selective growth using a mask with the outermost surface of TiN similarly to selective growth using the mask with outermost surface of SiN, each sample exhibits a single peak, which indicates inclination of crystal eyes, both in the parallel and vertical directions relative to the mask. Additionally, it is confirmed that the full width at half maximum (FWHM) indicating variance in inclination of crystal axes within the measured range. This demonstrates a high crystalline quality of the selectively grown film.

The present invention has been made through these researches by the Inventor.

According to the first aspect of the invention, there is provided a growth method of a nitride III–V compound semiconductor for forming a growth mask on a substrate and selectively growing a nitride III–V compound semiconductor on the substrate by using the growth mask, characterized in:

using as the growth mask a multi-layered film in which at least a top surface thereof is made of a nitride.

According to the second aspect of the invention, there is provided a manufacturing method of a semiconductor device for forming a growth mask on a substrate, and selectively growing nitride III–V compound semiconductors on the substrate by using the growth mask, characterized in:

using as the growth mask a multi-layered film in which at least a top surface thereof is made of a nitride.

According to the third aspect of the invention, there is provided a semiconductor device using nitride III–V compound semiconductors, characterized in that a growth mask, in which at least a top surface thereof is made of a nitride, is formed on a substrate, and nitride III–V compound semiconductors are selectively grown on the substrate by using the growth mask.

In the present invention, the nitride on the surface of the multi-layered film forming the growth mask may be any nitride basically. However, its specific examples are silicon nitride (SiN) and titanium nitride (TiN). Thickness of the nitride is preferably in the range from 1 nm to 3 μm. The multi-layered film may be any of various combinations such as combination of an oxide film and a nitride film thereon, combination of a metal film and a nitride film thereon, combination of an oxide film, a film thereon made up of a nitride and an oxide, and a nitride film thereon, and combination of a first metal film, a second metal film thereon different from the first metal film and a nitride film thereon, for example. The oxide film may be a silicon oxide film, for example, the nitride film may be a metal nitride film such as silicon nitride (SiN) film or titanium nitride (TiN) film, the metal film may be a titanium (Ti) film or a platinum (Pt) film, and the film made up of a nitride and an oxide may be gradually a silicon nitride oxide (SiN$_{1-x}$O$_x$ (where 0<x<1)) film, for example. Any of these multi-layered films may be gradually changed in composition at one or more boundaries, if so desired.

Configuration of the growth mask may be selected appropriately from various configurations. A typical configuration thereof is a stripe extending in one direction relative to the substrate.

In the present invention, after forming on the substrate a first growth mask in form of a multi-layered film including a nitride to form at least its top surface, then selectively growing a first nitride III–V compound semiconductor on the substrate by using the first growth mask, and thereafter forming a second growth mask in form of a multi-layered film including a nitride to form its top surface on the first nitride III–V compound semiconductor above the locations of the substrate not covered by the first growth mask, a second nitride III–V compound semiconductor may be selectively grown on the first nitride III–V compound semiconductor by using the second growth mask.

In the present invention, the growth mask may be used as an electrode. In this case, the growth mask must include a conductive film such as metal film as its bottom layer, or include a conductive nitride as its top surface. Specific examples of the growth mask are combination of a metal film and a nitride film thereon, combination of a metal film, a film thereon made up of a nitride and an oxide, and a nitride film thereon, combination of a first metal film, a second metal film thereon different from the first metal film, and a nitride film thereon, combination of an oxide film and a titanium nitride film thereon, combination of a metal film and a titanium nitride film thereon, combination of an oxide film, a film thereon made up of a nitride and an oxide, and a titanium nitride film thereon, and combination of a first metal film, a second metal film thereon different from the first metal film, and a titanium nitride film thereon. The same films as those mentioned above are usable as the oxide film, the metal film, and the film made up of a nitride and an oxide.

In the present invention, the substrate may be a sapphire substrate, SiC substrate, Si substrate or spinel substrate, with or without a nitride III–V compound semiconductor grown thereon.

In the present invention, usable for growth of the nitride III–V compound semiconductor are metal organic chemical vapor deposition (MOCVD), hydride vapor phase epitaxy (HVPE), are molecular beam epitaxy (MBE).

In the present invention, the nitride III–V compound semiconductor is made up of at least one group III element selected from the group consisting of Ga, Al, In, B and Tl, and one or more group V elements which include at least N and may additionally include As or P, where appropriate. Specific examples of the nitride III–V compound semiconductor are GaN, AlGaN, AlN, GaInN, AlGaInN and InN.

In the present invention having the above-summarized structure, since a multi-layered film, which includes a nitride forming at least its top surface, is used as the growth mask, the nitride on the top surface brings longitudinal crystal axes of the grown film into alignment during selective growth of the nitride III–V compound semiconductor, and thereby reduces irregular alignment of longitudinal crystal axes of the grown layer.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
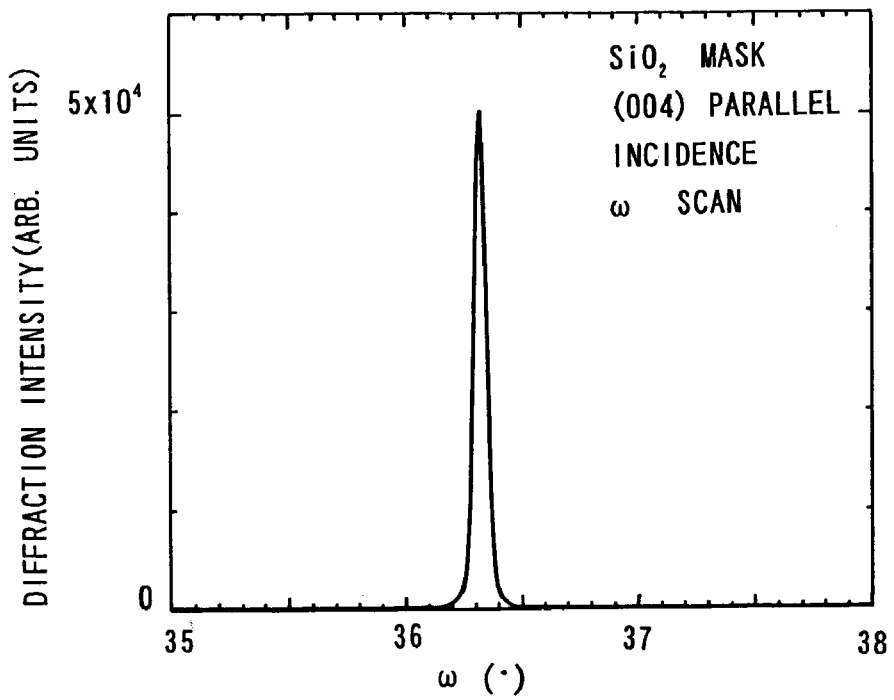
FIG. 1 is a diagram showing a result of measurement of X-ray diffraction spectrum by introducing X-rays in parallel with the mask into a GaN layer selectively grown by using a $SiO_2$ mask as the growth mask.
Figure 2:
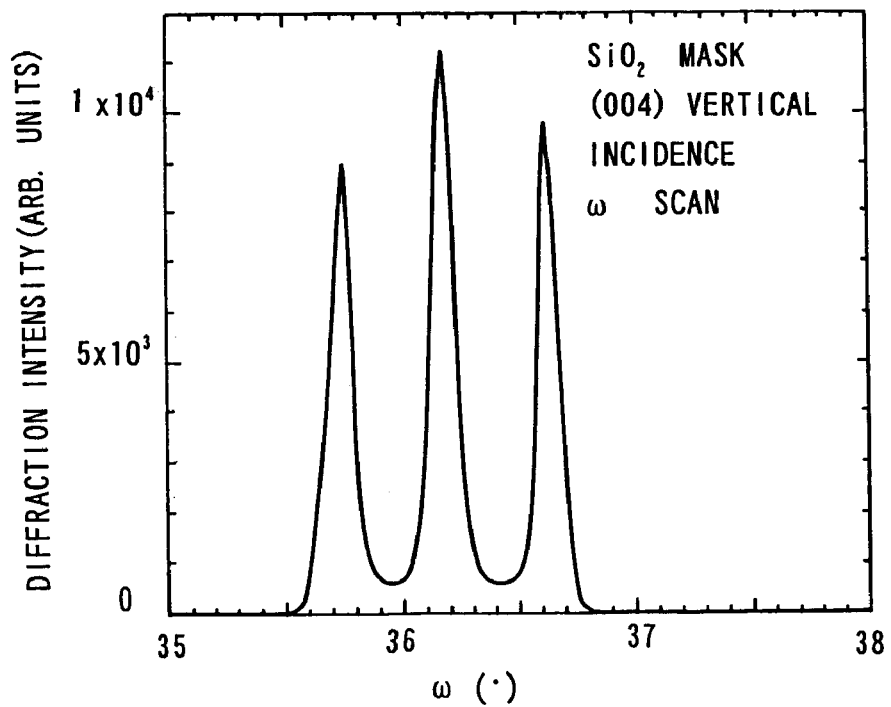
FIG. 2 is a diagram showing a result of measurement of X-ray diffraction spectrum by introducing X-rays vertically of the mask into the GaN layer selectively grown by using the $SiO_2$ mask as the growth mask.
Figure 3:
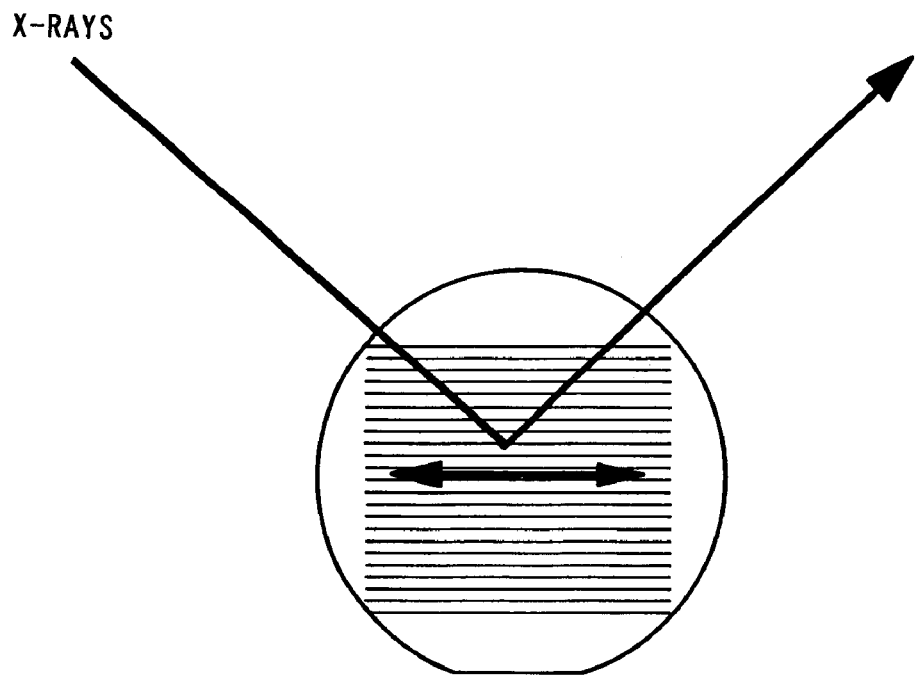
FIG. 3 is a diagram showing an aspect in which X-rays are introduced in parallel with the mask.
Figure 4:
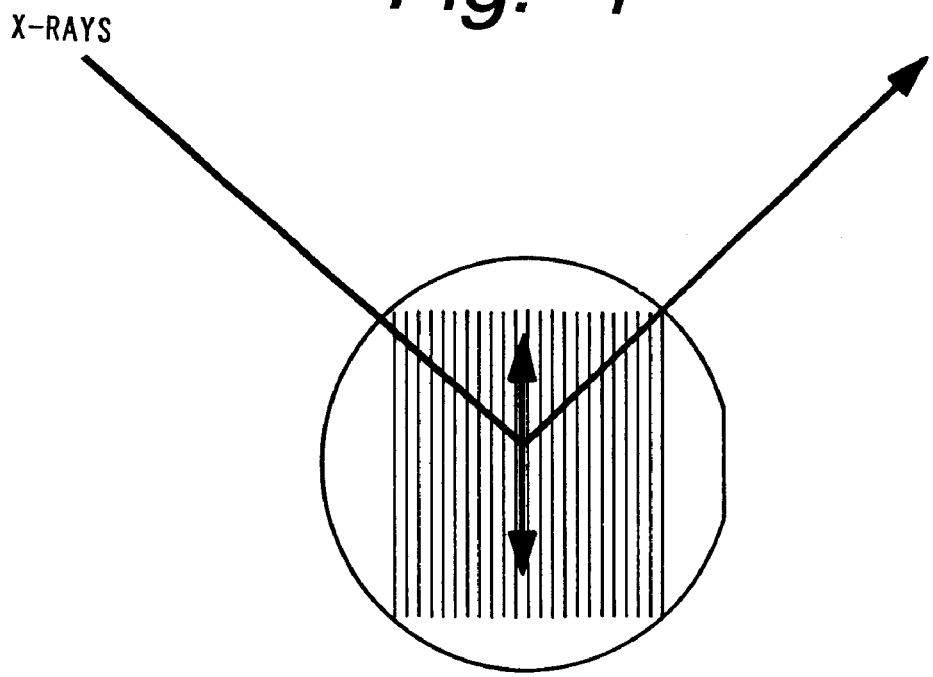
FIG. 4 is a diagram showing an aspect in which X-rays are introduced vertically of the mask.
Figure 5:
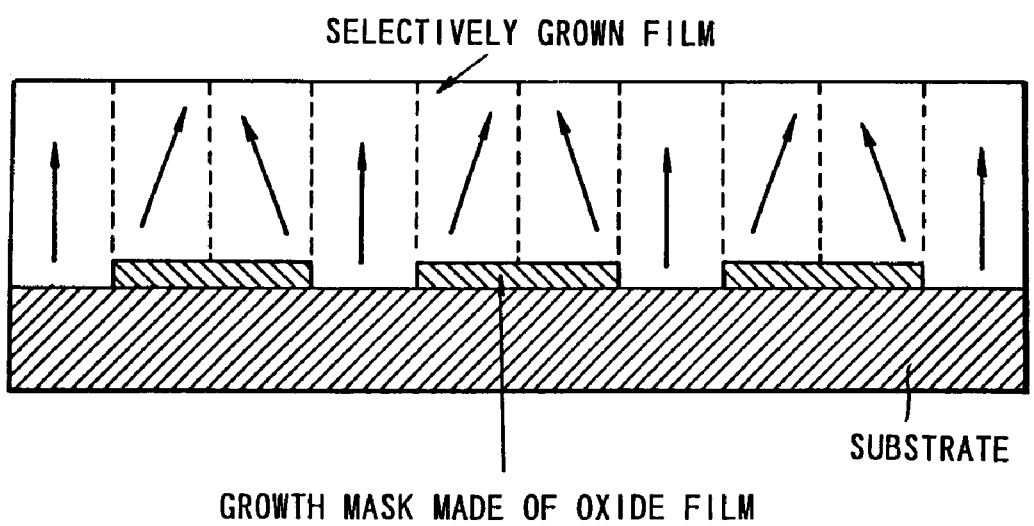
FIG. 5 is a diagram schematically showing inclination of crystal axes of a GaN layer selectively grown by using a $SiO_2$ mask as the growth mask.
Figure 6:
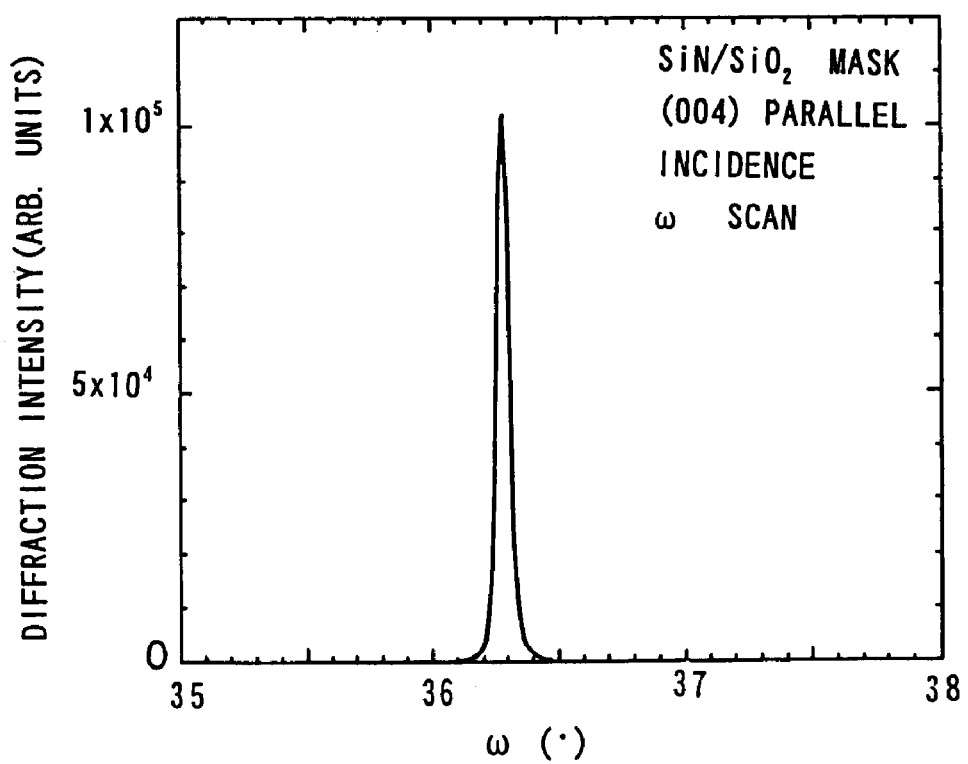
FIG. 6 is a diagram showing a result of measurement of X-ray diffraction spectrum by introducing X-rays in parallel with the mask into a GaN layer selectively grown by using a $SiN/SiO_2$ mask as a growth mask.
Figure 7A:
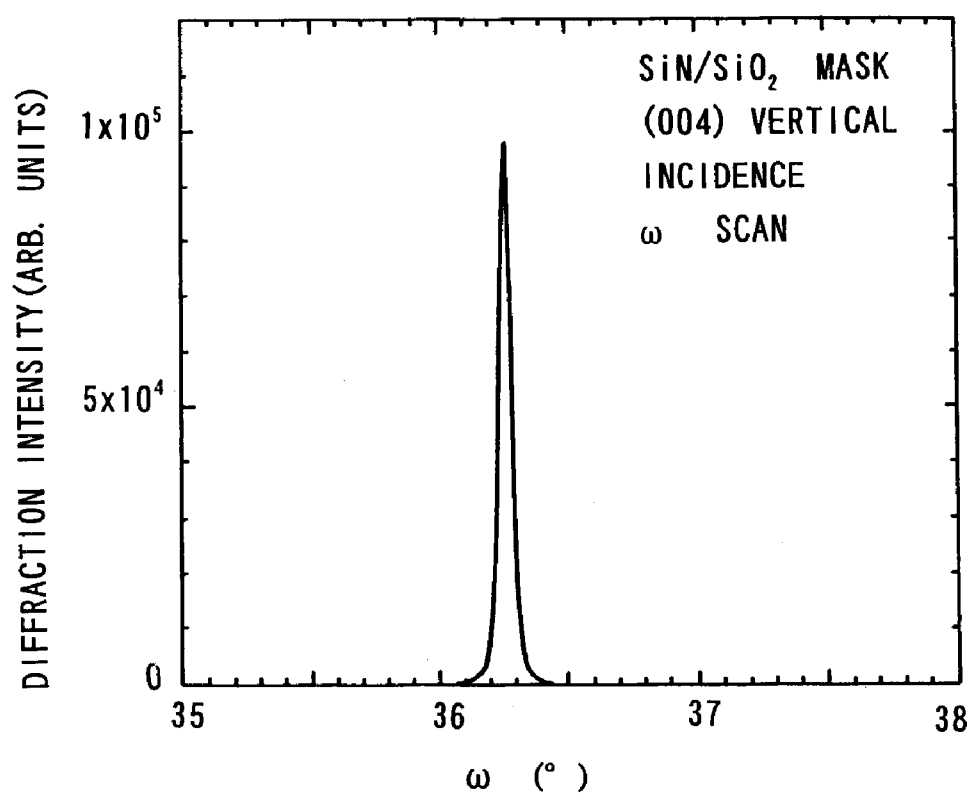
FIG. 7A is a diagram showing a result of measurement of X-ray diffraction spectrum by introducing X-rays vertically of the mask into the GaN layer selectively grown by using the $SiN/SiO_2$ mask as the growth mask.
Figure 7B:
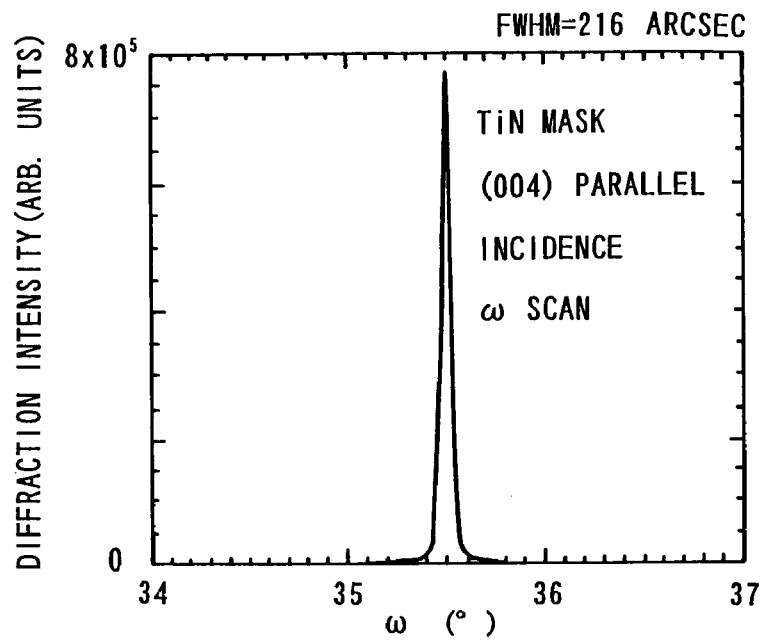
FIG. 7B is a diagram showing a result of measurement of X-ray diffraction spectrums by introducing X-rays in parallel with the mask into the GaN layer selectively grown by using the TiN mask as the growth mask.
Figure 7C:
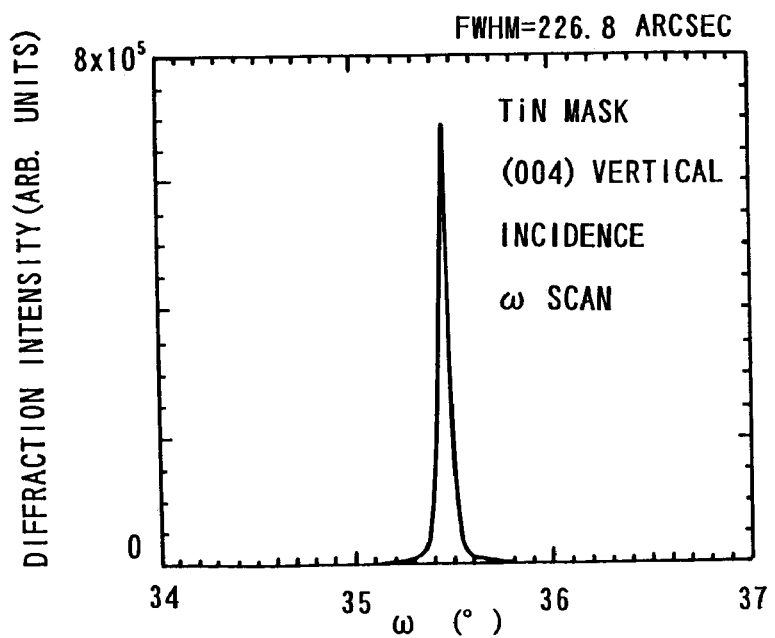
FIG. 7C is a diagram showing a result of measurement of X-ray diffraction spectrums by intorducing X-rays vertically of the mask into the Gan layer selectively grown by using the TiN mask as the growth mask.
Figure 8:
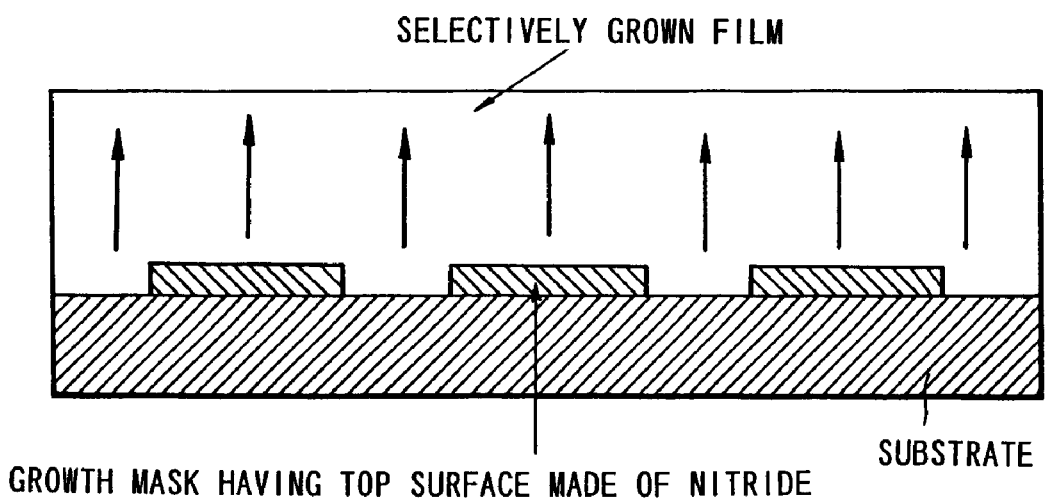
FIG. 8 is a diagram schematically showing inclination of crystal axes of a GaN layer selectively grown by using a growth mask which includes a nitride forming at least its top surface.

Explained below are embodiments of the invention with reference to the drawings. In all of the drawings illustrating embodiments, the same or equivalent components are labeled with common reference numerals.

FIGS. 9 through 14 show a manufacturing method of a GaN semiconductor laser according to the first embodiment of the invention. The GaN semiconductor laser shown here has a SCH structure (separate confinement heterostructure).

Figure 9:
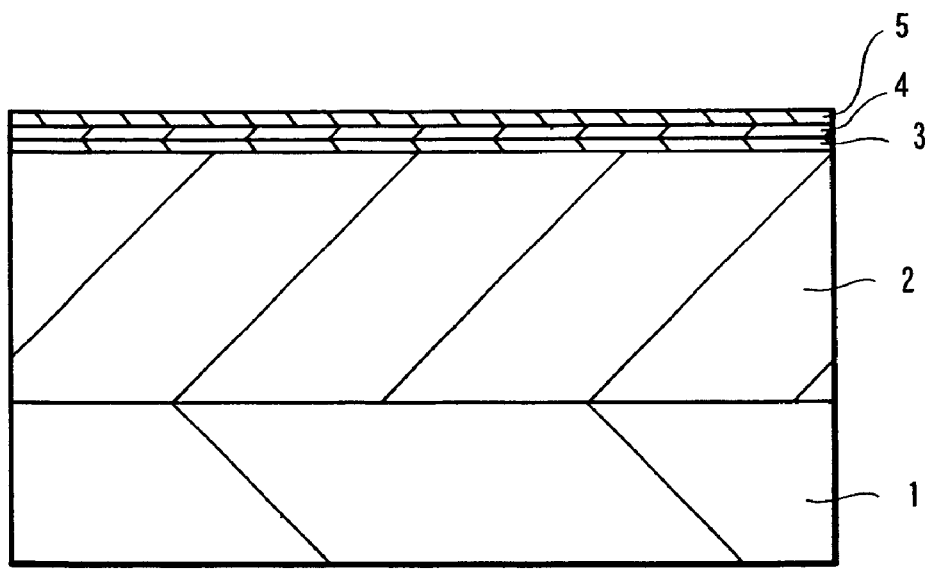
FIG. 9 is a cross-sectional view for explaining a manufacturing method of a GaN compound semiconductor laser according to the first embodiment of the invention.

In the first embodiment, first as shown in FIG. 9, an n-type GaN/undoped GaN layer 2 including an undoped GaN layer and an overlying n-type GaN layer is grown on a c-plane sapphire substrate 1 having a previously cleaned surface. For growth of the n-type GaN/undoped GaN layer 2, any of MOCVD, HVPE and MBE, for example, may be used. Next formed sequentially on the n-type GaN/undoped GaN layer 2 are a first film 3 made of an oxide and a metal, a second film 4 made of a nitride and an oxide, and a third film 5 made of an electrically conductive nitride. More specifically, a $SiO_2$ film Ti film or Pt film, for example, is used as the first film 3, a $SiN_{1-x}O_x$ (o<x<1) film, Ti film or Pt film, for example is used as the second film 4, and a TiN film or a SiN film, for example, is used as the third film 5. Since the growth mask made up of these first film 3, second film 4 and third film 5 is used as an electrode as explained later, at least one of the first film 3 and the third film 5 must be electrically conductive. In case that a metal film such as TiN film or SiN film is used as the first film 3, for example, the third film 5 may be any of a TiN film or a SiN film. If the first film 3 is an oxide film such as $SiO_2$ film, the third film 5 should be a conductive TiN film. For making these first film 3, second film 4 and third film 5, vacuum evaporation, sputtering and CVD, for example, may be used. The TiN film used as the third film 5 may be formed directly, or by first making a Ti film and thereafter annealing the Ti film in hot ammonium ($NH_3$) for its nitrogenization. If necessary, before making these first film 3, second film 4 and third film 5, the surface of the n-type GaN/undoped GaN layer is processed by etching using a hydrofluoric acid, for example, to remove dust or an oxide film therefrom.

Figure 10:
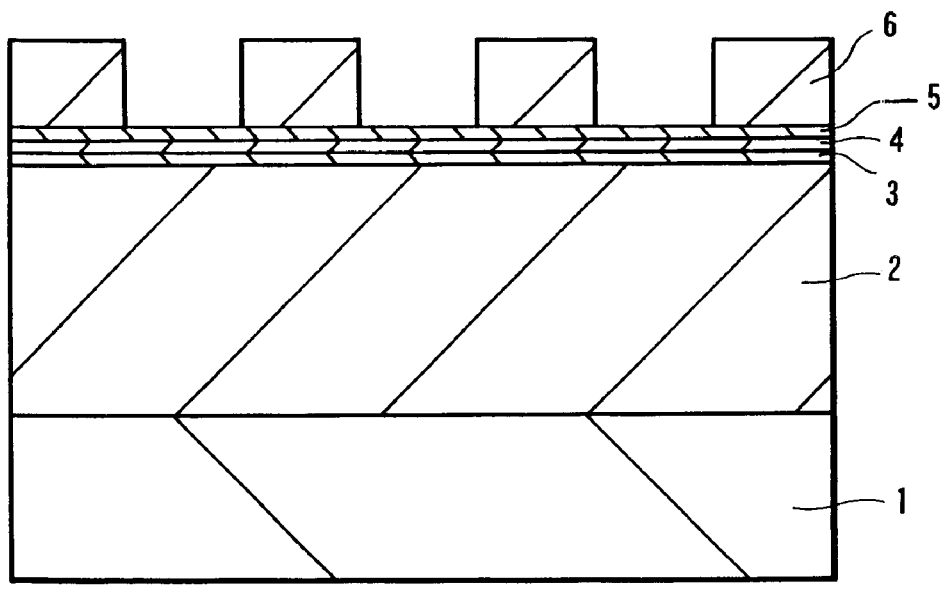
FIG. 10 is a cross-sectional view for explaining the manufacturing method of the GaN compound semiconductor laser according to the first embodiment of the invention.

Next as shown in FIG. 10, a resist pattern 6 in form of stripes extending vertically of the direction of the stripe of the semiconductor laser in predetermined intervals is formed on the third film 5 by lithography. The extending direction of the resist pattern 6 may be vertical of the <11–20> orientation of the c-plane sapphire substrate 1, for example.

Figure 11:
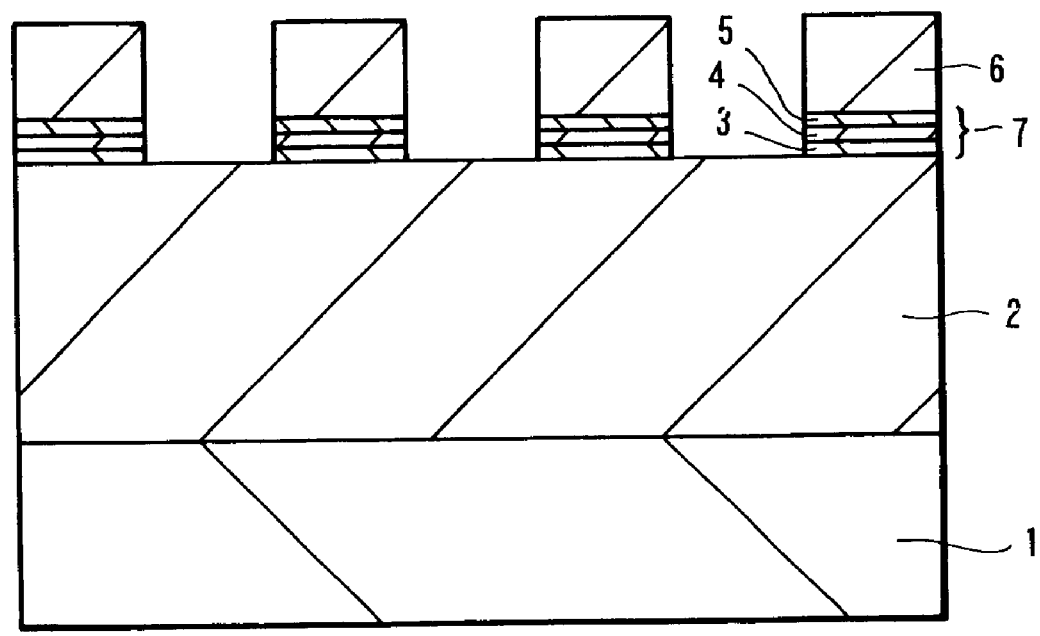
FIG. 11 is a cross-sectional view for explaining the manufacturing method of the GaN compound semiconductor laser according to the first embodiment of the invention.

Next as shown in FIG. 11, using the resist pattern 6 as a mask, the third film 5, second film 4 and first film 3 are etched sequentially to form a growth mask 7 including these first film 3, second film 4 and third film 5. Width of the growth mask 7 may be determined appropriately, such as 4.8 μm, for example. For its etching, dry etching like reactive ion etching (RIE) or wet etching using an etchant of a hydrofluoric acid, for example, may be used.

Figure 12:
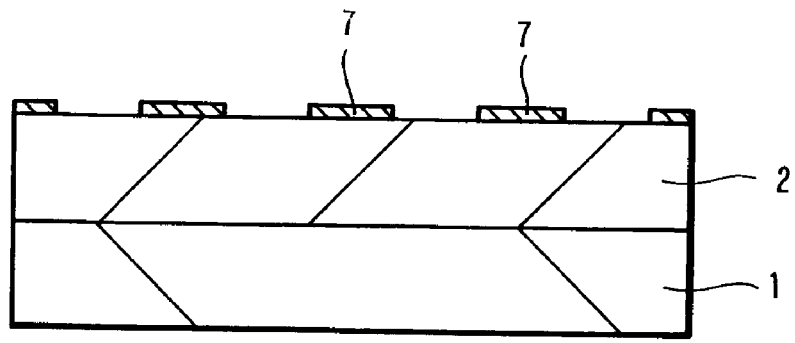
FIG. 12 is a cross-sectional view for explaining the manufacturing method of the GaN compound semiconductor laser according to the first embodiment of the invention.

Next as shown in FIG. 12, the resist pattern 6 is removed.

Figure 13:
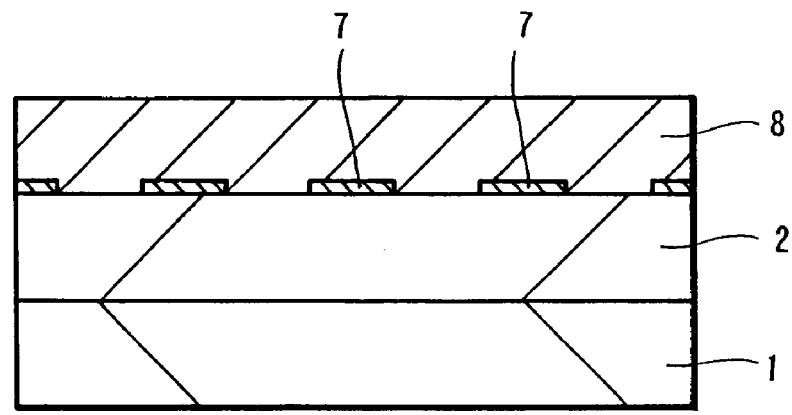
FIG. 13 is a cross-sectional view for explaining the manufacturing method of the GaN compound semiconductor laser according to the first embodiment of the invention.

After that, the c-plane sapphire substrate 1 having formed the growth mask 7 is introduced into a reaction tube of a MOCVD apparatus. This reaction tube is made of quartz or stainless steel, for example. Simultaneously introduced into the reaction tube are trimetyl gallium (TMG) or triethyl gallium (TEGa), for example, as the source material of Ga, hydrogen ($H_2$) or nitrogen ($N_2$), for example, as the carrier gas, and silane ($SiH_4$), for example, as the n-type dopant. In this case, for ensuring good selective growth, the supply amount of the source material is adjusted to limit the growth rate preferably not higher than 6 μm. Substrate temperature is set in the range from 500° C. to 1200° C., for example, taking it into account that low temperatures below 500° C. cannot give a sufficient migration energy to the source material supplied onto the c-plane sapphire substrate 1 having formed the growth mask 7, whereas high temperatures exceeding 1200° C. cannot ensure a sufficient growth rate because of an excessive decrease of the adhesion coefficient of the source material and cannot ensure the safety of the reaction tube. In this manner, as shown in FIG. 13, selective growth occurs on the n-type GaN/undoped GaN layer 2 having formed the growth mask 7, and an n-type GaN layer 8 much reduced in distribution of longitudinal crystal axes and having a good crystalline quality is obtained as a continuous film.

Figure 14:
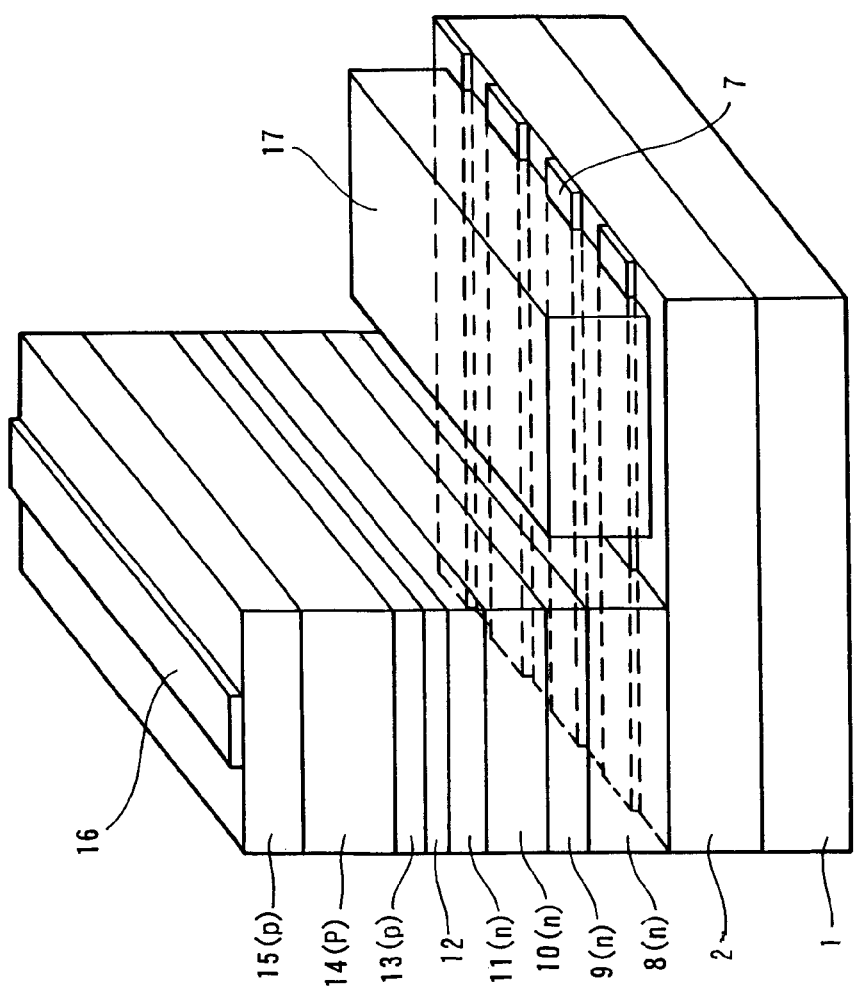
FIG. 14 is a cross-sectional view for explaining the manufacturing method of the GaN compound semiconductor laser according to the first embodiment of the invention.

Next as shown in FIG. 14, sequentially grown on the n-type GaN layer 8 by MOCVD are an n-type GaN layer 9, n-type AlGaN cladding layer 10, n-type GaN optical guide layer 11, active layer 12 having a $Ga_{1-x}In_xN/Ga_{1-y}In_yN$ multi quantum well structure, for example, p-type GaN optical guide layer 13, p-type AlGaN cladding layer 14 and p-type GaN contact layer 15. In this case, since the n-type GaN layer as their base layer is a high-quality single crystal having a low density of crystal defects, these layers also grow as high-quality single crystals with low densities of crystal defects. Growth temperature is set to approximately 1000° C., for example, for growth of the layers not containing In, namely, n-type AlGaN cladding layer 10, n-type GaN optical guide layer 11, p-type GaN optical guide layer 13, p-type AlGaN cladding layer 14 and p-type GaN contact layer 15, and to approximately 700° C., for example, for growth of the layer containing In, namely, the active layer 12 having the $Ga_{1-x}In_xN/Ga_{1-y}In_yN$ multi quantum well structure. In an example, thicknesses of these layers are 3 μm of the n-type GaN layer 9, 0.5 μm of the n-type AlGaN cladding layer 10, 0.1 μm of the n-type GaN optical guide layer 11, 0.1 μm of the p-type GaN optical guide layer 12, 0.5 μm of the p-type AlGaN cladding layer 14, and 0.5 μm of the p-type GaN contact layer 15. Al composition is 0.1, for example, in the n-type AlGaN cladding layer 10 and the p-type AlGaN cladding layer 14. The n-type GaN layer 9, n-type AlGaN cladding layer 10 and n-type GaN optical guide layer 11 are doped with Si, for example, as their donor, and the p-type GaN optical guide layer 13, p-type AlGaN cladding layer 14 and p-type GaN contact layer 15 are doped with Mg as their acceptor. After that, annealing is conducted to electrically activate the donor and the acceptor doped into these layers, especially the acceptor doped into the p-type GaN optical guide layer 13, p-type AlGaN cladding layer 14 and p-type GaN contact layer 15. Temperature for the annealing is approximately 700° C., for example.

Thereafter, a stripe-shaped resist pattern (not shown) with a predetermined width is formed on the p-type GaN contact layer 15 to extend in the <11–20> orientation of the c-plane sapphire substrate 1, for example. Using the resist pattern as a mask, layers are etched by RIE, for example, until exposing the n-type GaN/undoped GaN layer 2 and the growth mask 7 to pattern the p-type GaN contact layer 15, p-type AlGaN cladding layer 14, p-type GaN optical guide layer 13, active layer 12, n-type GaN optical guide layer 11, n-type AlGaN cladding layer 10, n-type GaN layer 9 and n-type GaN layer 8 into a mesa configuration.

Then, the resist pattern used as the etching mask is removed. Thereafter, a p-side electrode made of a Ni/Au film or a Ni/Pt/Au film for example, is formed on the p-type GaN contact layer 15, and an n-side electrode 17 made of a Ti/Al film, for example, is formed on the n-type GaN/ undoped GaN layer 2 and the growth mask 7 in the location adjacent to the mesa portion. The n-side electrode 17 is electrically connected to the n-type GaN layer 8 via the n-type GaN/undoped GaN layer 2.

After that, the c-plane sapphire substrate 1 having formed the laser structure through those steps is divided into bars by cleavage, for example, to make opposite cavity edges, and an edge coating is coated on these cavity edges. Thereafter, each bar is divided into chips by cleavage, for example through these steps, the intended GaN compound semiconductor laser having the SCH structure is completed.

As explained above, according to the first embodiment, since the n-type GaN layer 8 having a good crystalline quality uniform in orientation of the longitudinal crystal axes is grown by selective growth using the growth mask 7, and the GaN compound semiconductor layers forming the laser structure are grown on the n-type GaN layer, a GaN compound semiconductor laser excellent in characteristics, elongated in lifetime and having a high reliability can be realized.

Figure 15:
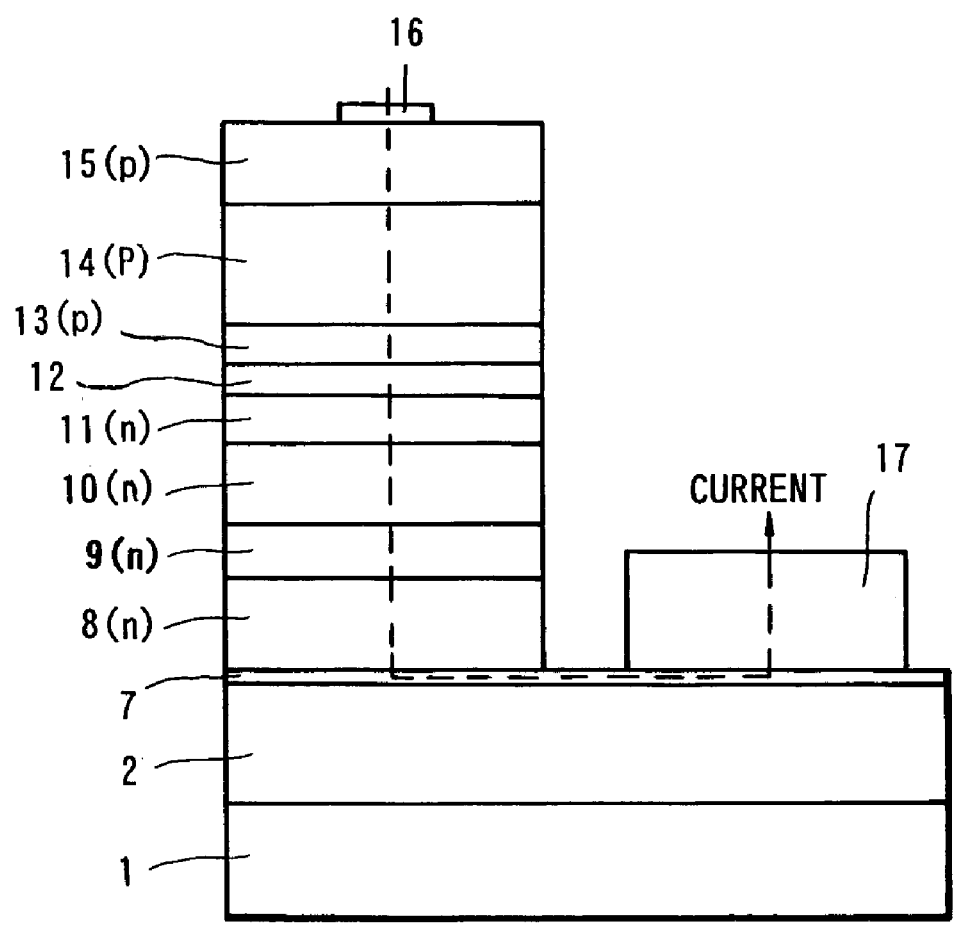
FIG. 15 is a cross-sectional view for explaining a current path in the GaN compound semiconductor laser according to the first embodiment.
Figure 16:
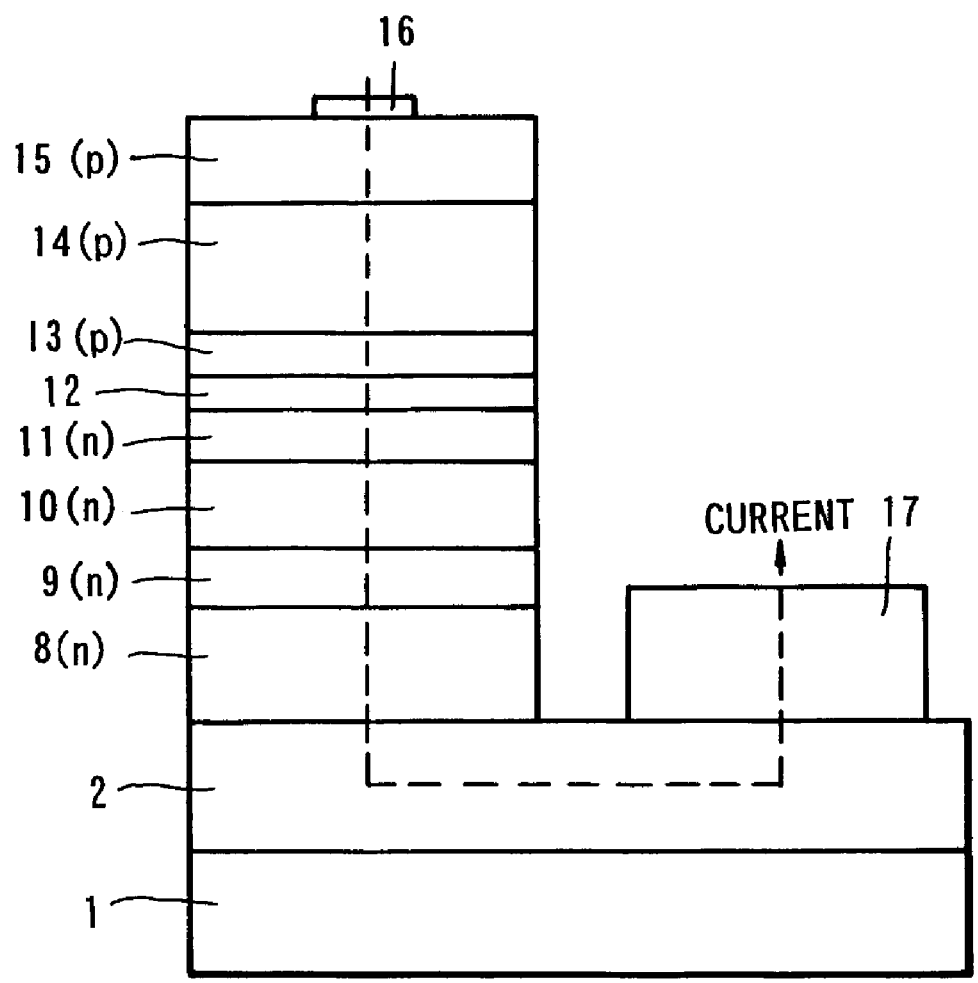
FIG. 16 is a cross-sectional view for explaining a current path in a GaN compound semiconductor laser which is made without using a conductive growth mask.

Additionally, in the GaN semiconductor laser according to the first embodiment, since at least one of the top layer and the bottom layer of the growth mask 7 is a metal film or a TiN film having a low specific resistance, a current introduced between the p-side electrode 16 and the n-side electrode 17 during operation flows through the growth mask 7 with a low resistance as shown in FIG. 15. Therefore, thickness and carrier concentration of the n-type GaN/ undoped GaN layer 2 do not affect the operation voltage, it is therefore possible to reduce the operation voltage. This is advantageous as compared with a laser shown in FIG. 16 in which, without the use of the conductive growth mask used in the first embodiment, the current introduced between the p-side electrode 16 and the n-side electrode 17 flows into the n-type GaN/undoped GaN layer having a higher specific resistance than those of metals and TiN, and the operation voltage is therefore affected by thickness and carrier concentration of the n-type GaN/undoped GaN layer 8.

Next explained is a manufacturing method of a GaN semiconductor laser according to the second embodiment of the invention. The GaN semiconductor laser shown here also has a SCH structure.

Figure 17:
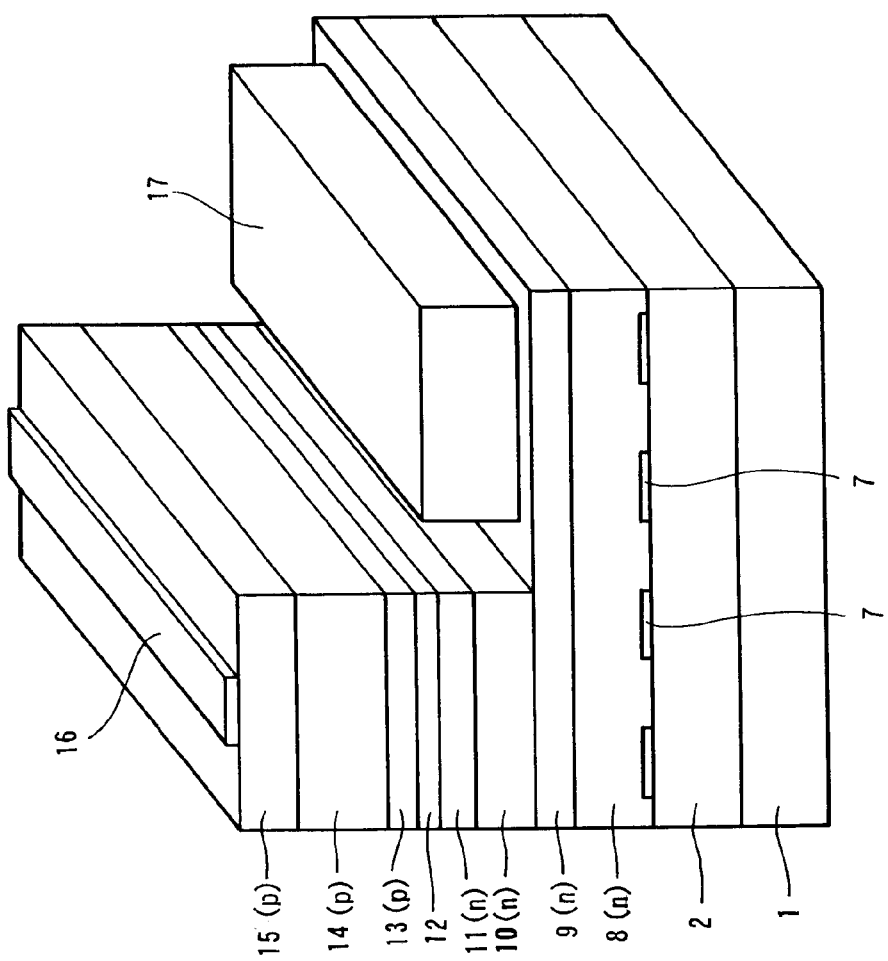
FIG. 17 is a perspective view for explaining a manufacturing method of a GaN compound semiconductor laser according to the second embodiment of the invention.

As shown in FIG. 17, in the second embodiment, the growth mask 7 is formed to extend in parallel with the direction of the stripe of the semiconductor laser. The growth mask 7 is a multi-layered film in which at least its top surface is made of a nitride. In this case, the nitride may be either conductive or insulating. The, in the same manner as the fist embodiment, the n-type GaN layer 8 is selectively grown by using the growth mask 7, and the n-type GaN layer 9, n-type AlGaN cladding layer 10, n-type GaN optical guide layer 11, active layer 12 having the $Ga_{1-x}In_xN/Ga_{1-y}In_yN$ multi quantum well structure, for example, p-type GaN optical guide layer 13, p-type AlGaN cladding layer 14 and p-type GaN contact layer 15 are sequentially grown on the n-type GaN layer 8.

Thereafter, a stripe-shaped resist pattern (not shown) with a predetermined width is formed on the p-type GaN contact layer 15 to extend in the <11–20> orientation of the c-plane sapphire substrate 1, for example. Using the resist pattern as a mask, layers are etched by RIE, for example, until exposing the n-type GaN layer 9 to pattern the p-type GaN contact layer 15, p-type AlGaN cladding layer 14, p-type GaN optical guide layer 13, active layer 12, n-type GaN optical guide layer 11, and n-type AlGaN cladding layer 10 into a mesa configuration.

Then, the resist pattern used as the etching mask is removed. Thereafter, the p-side electrode is formed on the p-type GaN contact layer 15, and the n-side electrode 17 is formed on the n-type GaN layer 9 in the location in the location adjacent to the mesa portion.

After that, the c-plane sapphire substrate 1 having formed the laser structure through those steps is divided into bars by cleavage, for example, to make opposite cavity edges, and an edge coating is coated on these cavity edges. Thereafter, each bar is divided into chips by cleavage, for example through these steps, the intended GaN compound semiconductor laser having the SCH structure is completed.

As explained above, according to the second embodiment, since the n-type GaN layer 8 having a good crystalline quality uniform in orientation of the longitudinal crystal axes is grown by selective growth using the growth mask 7, and the GaN compound semiconductor layers forming the laser structure are grown on the n-type GaN layer, a GaN compound semiconductor laser excellent in characteristics, elongated in lifetime and having a high reliability can be realized.

Having described specific preferred embodiments of the present invention with reference to the accompanying drawings, it is to be understood that the inventions is not limited to those precise embodiments, and that various changes and modifications may be effected therein by one skilled in the art without departing from the scope or the spirit of the invention as defined in the appended claims.

For example, numerical values, structures, substrate, source materials and processes raised in explanation of the first and second embodiments are not but examples, and any other appropriate numerical values, structures, substrates, source materials and processes may be employed.

In the first and second embodiments, the growth mask 7 has been explained as extending in the <11–20> orientation of the c-plane sapphire substrate 1. However, the extending direction of the stripe-shaped growth mask 7 may be the <1–100> direction, for example.

In the first and second embodiments, the c-plane sapphire substrate is used as the substrate. However, a SiC substrate, Si substrate or spinel substrate, for example, may be used if necessary.

Additionally, the first and second embodiments have been explained as applying the invention to fabrication of GaN compound semiconductor lasers, but the invention is applicable to fabrication of, needless to say, GaN light emitting diodes, and GaN compound FETs and other GaN compound electron transport devices as well.

As described above, the growth method of a nitride III–V compound semiconductor according to the invention can grow a single-crystal nitride III–V compound semiconductor of a high quality with a low density of crystal defects by using a multi-layered film including a nitride forming at least its top surface as the growth mask.

Additionally, the manufacturing method of a semiconductor device according to the invention can grow a single-crystal nitride III–V compound semiconductor of a high quality with a low density of crystal defects by using a multi-layered film including a nitride to form at least its top surface as the growth mask, and can therefore can manufacture a high-performance semiconductor device with good properties by using such nitride III–V compound semiconductors.

Moreover, according to the semiconductor device according to the invention, a good-property, high-performance semiconductor device can be made of single-crystal nitride III–V compound semiconductors of a high quality with a low density of crystal defects, which are selectively grown by using as the growth mask a multi-layered film including a nitride to form at least its top surface.

What is claimed is:

1. A growth method of nitride III–V compound semiconductor comprising forming a growth mask on a substrate and growing the nitride III–V compound semiconductor on the substrate and on said growth mask by using the growth mask, characterized in:
   using as said growth mask a multi-layered film in which at least a top surface thereof is made of a nitride, the nitride III–V compound semiconductor being grown on said substrate and in direct contact with said growth mask on at least the top surface of said growth mask,
   wherein said multi-layered film comprises a nitride film on a metal film, and
   wherein the metal film is a titanium film or a platinum film, and said nitride film is a silicon nitride film or a titanium nitride film.

2. The growth method of a nitride III–V compound semiconductor according to claim 1 wherein said multi-layered film comprises an oxide film under said nitride film.

3. The growth method of a nitride III–V compound semiconductor according to claim 2 wherein said oxide film is a silicon oxide film.

4. The growth method of a nitride III–V compound semiconductor according to claim 1 wherein said multi-layered film comprises an oxide film, and a film made of a nitride and an oxide on said oxide film, each being under said nitride film.

5. The growth method of a nitride III–V compound semiconductor according to claim 4 wherein said oxide film is a silicon oxide film, and said film made of the nitride and the oxide is a silicon nitride oxide film.

6. The growth method of a nitride III–V compound semiconductor according to claim 1 wherein said multi-layered film comprises said metal film, a second metal film different from said metal film and overlying said metal film, and said nitride film on said second metal film.

7. The growth method of a nitride III–V compound semiconductor according to claim 6 wherein each of said metal film and said second metal film is a titanium film or a platinum film.

8. The growth method of a nitride III–V compound semiconductor according to claim 1 wherein said growth mask is stripe-shaped.

9. The growth method of a nitride III–V compound semiconductor according to claim 1 characterized in: forming on said substrate a first growth mask in form of a multi-layered film in which at least a top surface thereof is made of a nitride; selectively growing a first nitride III–V compound semiconductor on said substrate by using said first growth mask; thereafter forming a second growth mask in form of a multi-layered film, in which at least a top surface thereof is made of a nitride, on said substrate in locations not covered by said first growth mask; and selectively growing a second nitride III–V compound semiconductor on said first nitride III–V compound semiconductor by using said second growth mask.

10. The growth method of a nitride III–V compound semiconductor according to claim 1 wherein said substrate is a sapphire substrate, a SiC substrate, a Si substrate or a spinel substrate with or without a nitride III–V compound semiconductor grown thereon.

11. A manufacturing method of a semiconductor device comprising forming a growth mask on a substrate, and growing nitride III–V compound semiconductors on said substrate and on said growth mask by using said growth mask, characterized in:
using as said growth mask a multi-layered film in which at least a top surface thereof is made of a nitride, the nitride III–V compound semiconductors being grown on said substrate and in direct contact with said growth mask on at least the top surface of said growth mask,
wherein said multi-layered film comprises a nitride film on a metal film, and
wherein the metal film is a titanium film or a platinum film, and said nitride film is a silicon nitride film or a titanium nitride film.

12. The manufacturing method of a semiconductor device according to claim 7 wherein said multi-layered film comprises an oxide film under said nitride film.

13. The manufacturing method of a semiconductor device according to claim 12 wherein said oxide film is a silicon oxide film.

14. The manufacturing method of a semiconductor device according to claim 11 wherein said multi-layered film comprises an oxide film, and a film made of a nitride and an oxide on said oxide film, each being under said nitride film.

15. The manufacturing method of a semiconductor device according to claim 14 wherein said oxide film is a silicon oxide film, and said film made of the nitride and the oxide is a silicon nitride oxide film.

16. The manufacturing method of a semiconductor device according to claim 11 wherein said multi-layered film comprises said metal film, a second metal film different from said metal film and overlying said metal film, and said nitride film on said second metal film.

17. The manufacturing method of a semiconductor device according to claim 16 wherein each of said metal film and said second metal film is a titanium film or a platinum film.

18. A manufacturing method of a semiconductor device comprising forming a growth mask on a substrate, and growing nitride III–V compound semiconductors on said substrate and on said growth mask by using said growth mask, characterized in:
using as said growth mask a multi-layered film in which at least a top surface thereof is made of a nitride, the nitride III–V compound semiconductors being grown on said substrate and in direct contact with said growth mask on at least the top surface of said growth mask,
wherein said growth mask is used as an electrode.

19. The manufacturing method of a semiconductor device according to claim 18 wherein said growth mask includes a metal film and a nitride film thereon.

20. The manufacturing method of a semiconductor device according to claim 19 wherein said nitride film is a titanium nitride film.

21. The manufacturing method of a semiconductor device according to claim 18 wherein said growth mask includes an oxide film, a film made of a nitride and an oxide on said oxide film, and a nitride film thereon.

22. The manufacturing method of a semiconductor device according to claim 21 wherein said nitride film is a titanium nitride film.

23. The manufacturing method of a semiconductor device according to claim 18 wherein said growth mask includes a first metal film, a second metal film different from said first metal film and overlying said first metal film, and a nitride film on said second metal film.

24. The manufacturing method of a semiconductor device according to claim 23 wherein said nitride film is a titanium nitride film.

25. The manufacturing method of a semiconductor device according to claim 18 wherein said growth mask includes an oxide film and a titanium nitride film thereon.

26. The manufacturing method of a semiconductor device according to claim 18 wherein said growth mask includes a metal film and a titanium nitride film thereon.

27. The manufacturing method of a semiconductor device according to claim 18 wherein said growth mask includes an oxide film, a film made of a nitride and an oxide on said oxide film, and a nitride film thereon.

28. The manufacturing method of a semiconductor device according to claim 18 wherein said growth mask includes a first metal film, a second metal film different from said first metal film and overlying said first metal film, and a titanium nitride film on said second metal film.

29. The manufacturing method of a semiconductor device according to claim 11 wherein said growth mask is stripe-shaped.

30. The manufacturing method of a semiconductor device according to claim 11 characterized in: forming on said substrate a first growth mask in form of a multi-layered film in which at least a top surface thereof is made of a nitride; selectively growing a first nitride III–V compound semiconductor on said substrate by using said first growth mask; thereafter forming a second growth mask in form of a multi-layered film, in which at least a top surface thereof is made of a nitride, on said substrate in locations not covered by said first growth mask; and selectively growing a second nitride III–V compound semiconductor on said first nitride III–V compound semiconductor by using said second growth mask.

31. The manufacturing method of a semiconductor device according to claim 11 wherein said substrate is a sapphire substrate, a SiC substrate, a Si substrate or a spinel substrate with or without a nitride III–V compound semiconductor grown thereon.

* * * * *